United States Patent
Popescu

(10) Patent No.: US 10,338,183 B2
(45) Date of Patent: Jul. 2, 2019

(54) MAGNETIC RESONANCE IMAGING WITH DIFFERENT FREQUENCY ENCODING PATTERNS

(71) Applicant: Siemens Aktiengesellschaft, Munich (DE)

(72) Inventor: Stefan Popescu, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 722 days.

(21) Appl. No.: 14/790,134

(22) Filed: Jul. 2, 2015

(65) Prior Publication Data

US 2016/0003929 A1    Jan. 7, 2016

(30) Foreign Application Priority Data

Jul. 3, 2014  (DE) .................. 10 2014 212 943

(51) Int. Cl.
- *G01R 33/58* (2006.01)
- *G01R 33/48* (2006.01)
- *G01R 33/561* (2006.01)

(52) U.S. Cl.
CPC ......... *G01R 33/583* (2013.01); *G01R 33/482* (2013.01); *G01R 33/4824* (2013.01); *G01R 33/5611* (2013.01); *G01R 33/5616* (2013.01)

(58) Field of Classification Search
None
See application file for complete search history.

(56) References Cited

U.S. PATENT DOCUMENTS

| 2006/0145696 | A1 | 7/2006 | Fuderer et al. |
| 2007/0090838 | A1 | 4/2007 | Hennig |
| 2007/0297660 | A1 | 12/2007 | Hsieh et al. |
| 2010/0164495 | A1* | 7/2010 | Takizawa ............ G01R 33/482 324/309 |
| 2010/0237869 | A1 | 9/2010 | Griswold et al. |
| 2013/0278263 | A1* | 10/2013 | Huang ............... G01R 33/5611 324/309 |
| 2013/0281822 | A1 | 10/2013 | Graziani et al. |
| 2014/0197835 | A1 | 7/2014 | Kamada et al. |
| 2014/0285195 | A1* | 9/2014 | Stemmer ........... G01R 33/4818 324/309 |

FOREIGN PATENT DOCUMENTS

EP    1 915 089 B1    4/2013

OTHER PUBLICATIONS

Gallichan et al: "Simultaneously Driven Linear and Nonlinear Spatial Encoding Fields in MRI", Magn. Reson. Med, vol. 65, pp. 702-714, (2011).

Pruessmann et al: "Advances in Sensitivity Encoding With Arbitrary k-Space Trajectories", Magn Reson Med, vol. 46, No. 4, pp. 638-651, (2001).

* cited by examiner

*Primary Examiner* — Douglas X Rodriguez
(74) *Attorney, Agent, or Firm* — Schiff Hardin LLP

(57) ABSTRACT

In a method and control device for magnetic resonance imaging, raw magnetic resonance data are acquired from one region of an examination object by a number of magnetic resonance receiving antennas of a magnetic resonance system. Calibration values are determined that represent the sensitivity of at least one of the magnetic resonance receiving antennas. An image reconstruction is performed on the basis of the raw magnetic resonance data, taking into consideration the determined calibration values. The determination of the calibration values is frequency-dependent.

15 Claims, 5 Drawing Sheets

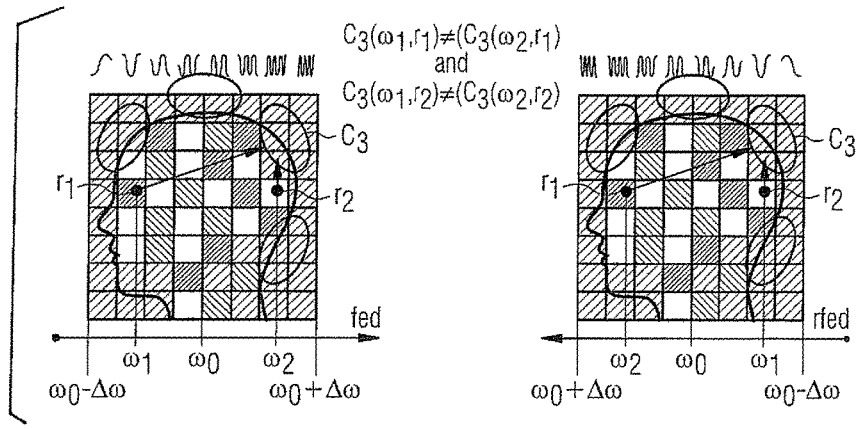
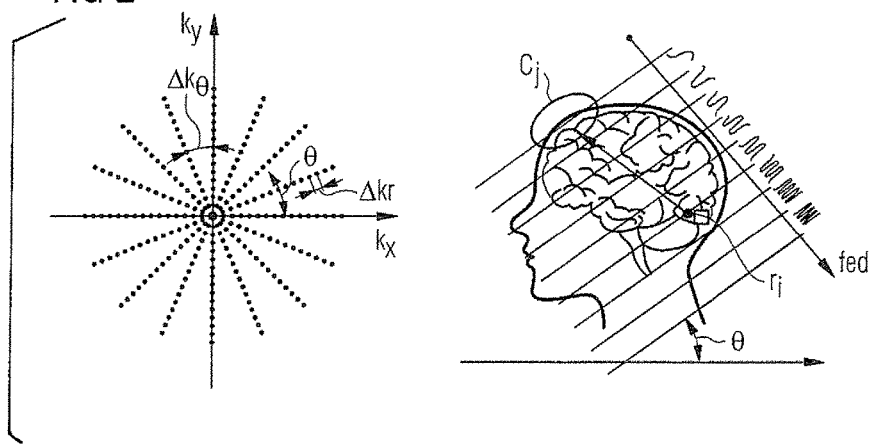

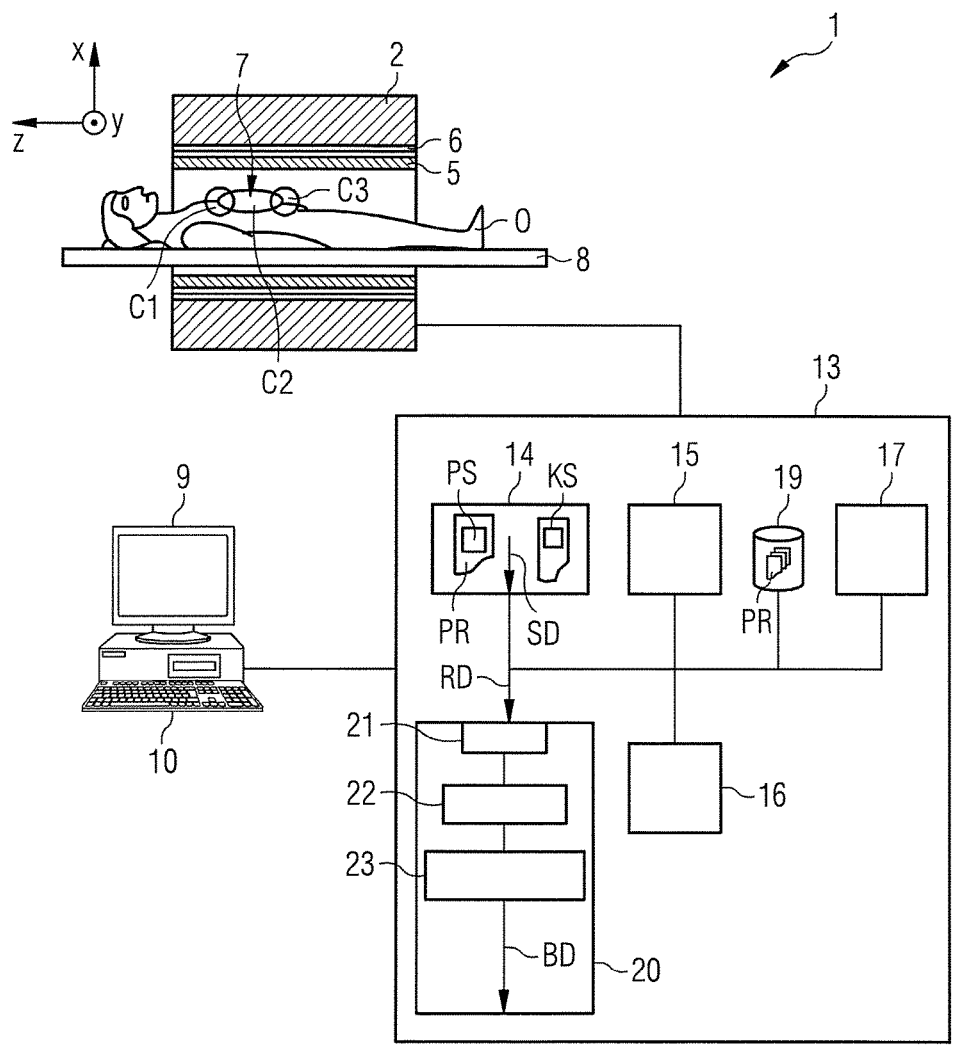

MAGNETIC RESONANCE IMAGING WITH DIFFERENT FREQUENCY ENCODING PATTERNS

BACKGROUND OF THE INVENTION

Field of the Invention

The invention relates to a method for magnetic resonance imaging and a control device for magnetic resonance imaging.

Description of the Prior Art

In a magnetic resonance system the body to be examined is normally exposed to a relatively high basic magnetic field, for example of 1.5, 3 or 7 Tesla, with the use of a basic field magnetic system. Following creation of the basic field, nuclei in the examination object align themselves with a non-vanishing nuclear magnetic dipole moment, frequently also called spin, along the field. This collective behavior of the spin system is described as macroscopic "magnetization". Macroscopic magnetization is the vector sum of all microscopic magnetic moments in the object at a particular location. In addition to the basic field, a magnetic field gradient is generated by a gradient system, by means of which the magnetic resonance frequency (Larmor frequency) is determined at the respective location. Using a radio-frequency transmission system, radio-frequency excitation signals (RF pulses) are transmitted by suitable antenna devices, which results in the macroscopic "magnetization" being tilted by a defined flip angle with respect to the magnetic field lines of the basic magnetic field. If such an RF pulse acts on spins that are already excited, they may be tipped into a different angular position or even flipped back into an initial state in parallel to the basic magnetic field. When the excited nuclear spins are relaxed, radio-frequency signals, known as magnetic resonance signals, are resonantly emitted and are received by suitable receiving antennas (also called magnetic resonance coils or receiving coils). The received signals are then demodulated and digitized, and are further processed as so-called "raw data". The acquisition of the magnetic resonance signals takes place in the spatial frequency domain, known as "k-space", wherein during a measurement e.g. of a slice, data entry points in k-space are proceeded through chronologically along a "gradient trajectory" (also called a "k-space trajectory") defined by the switching of the gradient pulses. In addition, the transmission of the RF pulses must be coordinated on a suitable chronological basis. The desired image data can ultimately be reconstructed from the raw data acquired in this way by a two-dimensional Fourier transformation following further processing steps that generally also depend on the method of acquisition. Alternatively, three-dimensional volumes can be excited on a defined basis in the interim and read out, the raw data being in turn sorted into three-dimensional k-space following further processing steps. A three-dimensional image data volume can then be reconstructed accordingly by a three-dimensional Fourier transformation.

Predefined pulse sequences, i.e. sequences of defined RF pulses and gradient pulses in different directions, and read-out windows, are normally used to control a magnetic resonance, scanner during the measurement, the receiving antennas being switched in the meantime to receive and the magnetic resonance signals being received and processed. With the use of a so-called measuring protocol these sequences are parameterized in advance for a desired examination, for example a particular contrast of the calculated images. The measuring protocol can also contain other control data for the measurement. There are a large number of magnetic resonance sequence techniques in accordance with which pulse sequences can be structured. One of the major challenges for future development in magnetic resonance imaging (MR imaging) is to speed up magnetic resonance sequence techniques without having to make extensive compromises in respect of resolution, contrast and susceptibility to artifacts.

Clinical MR imaging at present is based almost exclusively on so-called Cartesian imaging, in which the k-space points (i.e. the scanning points in k-space at which raw data are acquired) lie on the grid points of a Cartesian grid or raster and are scanned row by row or column by column. Using so-called PAT (Parallel Acquisition Technique) parallel imaging methods it has been possible to speed up clinical MR imaging significantly. In parallel MR imaging data acquisition is abridged, in that some of the rows of the raster actually necessary to reconstruct a fold-free image are not acquired in k-space. These missing rows are added subsequently in k-space during image reconstruction (for example in GRAPPA=Generalized Autocalibrating Partially Parallel Acquisition Imaging) or the fold artifacts resulting from scanning at too low a frequency are removed in the image space (for example SENSE=Sensitivity Encoding). One prerequisite for being able to employ the parallel imaging methods is that the radio-frequency signals should be received using several receiving coils (antennas), wherein the spatial sensitivity of the individual receiving coils must be known. The spatial sensitivity of the receiving coils, also called coil sensitivity below, is calculated with the help of so-called coil calibration measurement data. The coil calibration measurement data must generally be scanned sufficiently. Since the sensitivities generally vary slowly in spatial terms, it is normally sufficient if the coil calibration measurement data has a low spatial resolution. In general the coil calibration measurement data must be measured anew for each patient.

There are essentially two clinically employed PAT imaging methods: the SENSE method and the GRAPPA method. In both methods, as already described, a prerequisite for correct image reconstruction is the performance of a calibration measurement. During the calibration measurement a second data set, the so-called "coil calibration data set", is obtained. This coil calibration data set is scanned or measured in full (in other words sufficiently in accordance with Nyquist). The receive signals or magnetic resonance signals $S_1(t)$ obtained in this way are converted into raw data by demodulation and digitization, said raw data being used during a subsequent image reconstruction to replace the rows in k-space which are missing during the actual data acquisition.

The receive signal $S_1(t)$ is obtained for the 1-th receiving coil from the following signal equation:

$$S_1(t) = \iint C_1(r) \cdot s(r,t) \cdot e^{-i\phi(r,t)} dr \qquad (1)$$

Here s(r,t) represents the time-dependent magnitude of the MR signal from the location r in the examination region. $\Phi(r,t)$ represents the time-dependent phase of the MR signal from the location r. This phase depends on the signal history, e.g. on the phase encoding steps, and on the signal frequency, which is influenced for example by local gradient fields. $C_1(r)$ describes a complex location-dependent sensitivity profile of the 1-th receiving antenna coil.

In the SENSE method the sensitivities $C_1(r)$ of the receiving antenna coils are calculated directly from the calibration measurement data $S_1(t)$ using the method known to the person skilled in the art. The calibration in this case takes place in the image domain.

Using the calculated sensitivities $C_1(r)$, the fold artifacts resulting from scanning at a frequency that is too low are removed in the image space during the image reconstruction.

In the GRAPPA method the coil sensitivities $C_1(r)$ of the 1-th coil are not calculated directly, but are only taken into consideration implicitly. Interpolation weightings $w_1(k_x,k_y)$ are calculated from the calibration measurement data $S_1(t)$ acquired during the calibration measurement. The interpolation weightings $w_1(k_x,k_y)$ depend implicitly on the coil sensitivities $C_1(r)$. The rows in k-space that are missing (not filled) during the recording made at too low a frequency are added in k-space subsequently during the image reconstruction with the use of the interpolation weightings.

To determine the interpolation weightings $w_1(k_x,k_y)$, an equation system based on the data obtained during the calibration measurement is established. Generally so many scanning points are measured that the equation system is overdetermined. This equation system is then resolved using standard methods in the context of the smallest quadratic deviation.

With the use of the GRAPPA weightings, the missing raw data in k-space can be reconstructed, before the image data are reconstructed therefrom using the transformation in the image domain.

In the GRAPPA method, the coil sensitivities are therefore implicitly taken into consideration, by recording supplementary data around the center of k-space during the image recording and using this data to calibrate a uniform interpolation kernel, with which the missing data in k-space can be calculated.

However, in the conventional use of the aforementioned PAT methods, only a spatial dependency of the coil sensitivities $C_1(r)$ is taken into consideration. Until now the additional frequency dependency of the coil sensitivities on the local frequency $\omega(r)$ of the MR signal was not taken into consideration. The frequency dependency of the coil sensitivities is illustrated in detail in FIGS. 1 and 2.

PAT methods such as SENSE and GRAPPA have found a place in clinical MR imaging and supply images with a good image quality for Cartesian trajectories. However, neither method works robustly for non-Cartesian trajectories, such as radial or spiral trajectories for example. It was previously suspected that these problems occur as a result of unknown errors in the gradient trajectories. Attempts were made to calibrate the gradient trajectories in advance using dynamic field cameras for measuring magnetic fields and to make error corrections to the gradients. However, the problem still was not satisfactorily solved.

SUMMARY OF THE INVENTION

An object of the present invention is to provide a magnetic resonance data acquisition method in which the described scanning errors in non-Cartesian gradient trajectories can be avoided, or at least mitigated.

In the inventive method for magnetic resonance imaging, raw magnetic resonance data are acquired from one region of an examination object by a number of magnetic resonance receiving antennas of a magnetic resonance scanner. One or more magnetic resonance receiving antennas can be used for the acquisition. Calibration values are additionally determined, which represent the sensitivity of at least one of the magnetic resonance receiving antennas. Examples of calibration values include variables determined during the calibration such as the coil-dependent and location-dependent sensitivity $C_1(r, \omega)$ or the GRAPPA weightings $w_1(k_x, k_y, \omega)$ determined in the GRAPPA method ($\omega$ here represents the frequency dependency). In this case the calibration step can be performed in any order with respect to the recording of the raw data, or simultaneously therewith. An image reconstruction is performed on the basis of the raw magnetic resonance data that takes the determined calibration values into consideration. It is important that the calibration values are determined on a frequency-dependent basis. In other words, the frequency-dependent sensitivity of the magnetic resonance receiving antennas is taken into consideration when determining the calibration values. By taking the frequency dependency of the sensitivity of the magnetic resonance receiving antennas into consideration, errors are reduced during image reconstruction when using receiving trajectories which are not Cartesian. This is of major importance, in particular when using several magnetic resonance receiving antennas, since the errors have a particularly marked impact because of the way the magnetic resonance receiving antennas mutually influence one another. In principle the inventive method can also be employed with individual magnetic resonance receiving antennas, in order to reduce scanning errors during imaging with non-Cartesian receiving trajectories.

The inventive control device for a magnetic resonance measurement has a receiving unit designed to receive raw magnetic resonance data acquired from a region of an examination object by a number of magnetic resonance receiving antennas of the magnetic resonance scanner. Furthermore, the control device has a determination unit designed to determine, on a frequency-dependent basis, calibration values which represent the sensitivity of at least one of the magnetic resonance receiving antennas. The control device moreover has an image reconstruction unit designed to perform image reconstruction on the basis of the raw magnetic resonance data and taking into consideration the determined calibration values.

The inventive magnetic resonance system includes the inventive control device.

Many of the above-mentioned components of the inventive control device, in particular the determination unit and the reconstruction unit, can be implemented partially or wholly in the form of software modules. This is advantageous, since by installing software it is also possible to retrofit existing hardware devices to perform the inventive method. The invention hence also encompasses a non-transitory, computer-readable storage medium encoded with programming instructions, which can be loaded directly into a processor of a programmable control device of a magnetic resonance system. The program code causes the control device to implement all steps of the inventive method when the program is executed in the programmable control device. A computer terminal can also be regarded as a control device, with which a user can make inputs to control the magnetic resonance system.

The frequency dependency of the calibration values can be taken into consideration by determining several sets of calibration values on a frequency-dependent basis, each set being assigned to different frequency encoding patterns that are used when acquiring the raw data. Since the sensitivities, i.e. the sensitivity values of the magnetic resonance receiving antennas, can assume different values for different frequency encoding patterns, a separate set of calibration values is determined in each case for the different frequency encoding patterns. Different calibration values are used during the image reconstruction, based on the raw magnetic resonance data and taking into consideration the determined calibration values, for different sections of the receiving trajectory. Since the calibration can be performed with a relatively low resolution, the overall measurement time is not increased significantly by measuring additional calibration measurement data.

In an embodiment of the inventive method, several sets of calibration data are acquired for different frequency encoding patterns for the performance of the image reconstruction when determining the calibration values, and the calibration values are determined from the acquired calibration measurement data. The calibration values can be calculated, for example, on the basis of the acquired calibration measurement data, for frequency encoding patterns used during the acquisition of the raw data. By acquiring several sets of calibration measurement data at the object to be examined the physical parameters that influence the frequency dependency of the coil sensitivity values can be taken into consideration. The calibration measurement data can for example be frequency-dependent signal data or raw data in k-space.

Coil sensitivity values are determined in the image space as calibration values in the SENSE method, and interpolation weightings are determined or calculated in k-space in the GRAPPA method. Whereas a correction of image data takes place in the image space using the coil sensitivity values during the image reconstruction, the interpolation weightings are already used when the raw data are processed in k-space to obtain a full raw data set. "Full" in this case means that the density of the raw data in k-space satisfies the Nyquist scanning theorem.

Instead of acquiring coil sensitivity data, the determination of several sets of calibration values can take place on the basis of a transmit and/or receive profile measurement, for example using $B1^+$ field mapping and/or $B1^-$ field mapping. In this case the calibration is not based on magnetic resonance signal data, but values of the $B1^+$ magnetic field and/or of the BF magnetic field are measured as calibration measurement data for the region to be examined of an examination object. Then location-dependent conductivity values, i.e. the electrical conductivity $\sigma$ and the permittivity $\varepsilon$, are calculated on the basis of the acquired calibration measurement data. On the basis of the aforementioned determined physical variables the electrical conductivity $\sigma$ and the permittivity $\varepsilon$ are mapped. This alternative approach to collecting calibration measurement data is advantageous in MR imaging methods with continuously changing frequency encoding patterns. These occur for example during MR image recording with spiral receiving trajectories or other nonlinear receiving trajectories. Calibration values are calculated for certain frequency encoding patterns on the basis of the determined mappings. The calibration values needed for the image reconstruction are calculated by interpolation between the calibration values determined for the individual frequency encoding patterns.

In another embodiment of the inventive method, a Cartesian k-space trajectory is used as a frequency encoding pattern, in which adjacent rows in k-space are scanned in the opposite direction and different calibration values are determined for both scanning directions. In this case calibration measurement data sets need to be acquired for just two different frequency encoding patterns, which makes calibration particularly simple.

The inventive method can also be used in MR imaging with radial scanning patterns in the k-space. In this embodiment a receiving trajectory when determining the calibration measurement data comprises at least two scanning directions oriented at an angle to one another in k-space. In other words, frequency encoding patterns are used for the different sets of calibration measurement data, the k-space trajectories of which are oriented at an angle to one another.

Alternatively, the receiving trajectory can have three scanning directions in k-space oriented at 45° to one another when determining the calibration measurement data. To be able to determine the remaining coil calibration values which are not acquired by the scanned frequency encoding patterns, an interpolation between the calibration values resulting from the calibration measurement can additionally be performed. In this way the time needed for the calibration measurements is kept within bounds, wherein because of the normally only relatively slow frequency dependency of the coil sensitivity values the accuracy of the interpolation is sufficient.

In MR image recording with radial receiving trajectories a BLADE or PROPELLER method can also be used to determine the coil calibration values.

The inventive method can also be employed for nonlinear gradient profiles such as $Gz^2$, $Gxy$, $Gx^2-x^2$ for example, or O-Space, Patloc or 4D-Rio. In this variant of the inventive method it is generally expedient to perform a calibration on the basis of a transmitting and/or receiving profile measurement, for example of a $B1^+$ field mapping and/or a $B1^-$ field mapping.

An object of the present invention is to provide an MR elastography method that can be implemented with less outlay than conventionally.

The basis underlying the inventive method is the insight that, without mechanical excitation by a wave generator, the breathing movement or in general terms the natural movement of the body of the patient or of the object to be examined, exhibits dynamic processes that can be identified by acquiring a series of proton density-weighted volume images, and elasticity values for the imaged volume can be determined therefrom. In other words, the invention avoids the use of a wave generator, and instead uses the natural body movement of the patient in order to represent the elasticity in a specific image volume with a dynamic imaging method.

In the method for determining the elasticity of a material of an examination object contained in a subarea of an acquired image volume, for instance an animal or a human, an image volume is firstly recorded e.g. with an MR imaging method in at least two different time intervals during a body movement of the examination object. At least two images of the image volume are thus recorded. An MR imaging method can be used, for instance for the recording. The raw data acquired during the imaging is then reconstructed to form image data in the image space. The images are registered with one another in an additional method step. An image registration is used, for example, to bring two or more images recorded temporally one after the other into concordance as closely as possible. One of the images is defined as a reference image. The remaining images are referred to as object images in this context. In order to adjust these optimally to the reference image, a balancing transformation is calculated. The images to be registered differ from one another because they were recorded at different points in time in different movement states. A deformation field is then determined from the registration of the images that are recorded in a temporally offset manner or the transformation determined in this way. The deformation field provides information relating to the dynamic behavior of the material included in a subarea of the acquired image volume. The deformation field includes information relating to the local or locally-dependent deformation in the subarea of the image volume. It is then possible to conclude the elasticity of the material included in the subarea of the image volume from the determined local deformation by calculating the mentioned differential equation system. The elasticity can only be estimated directly, e.g. by a proportionality assumption. Otherwise the differential equation must be solved, which is possible for instance with the use of a biomechanical model that is subsequently determined.

A simplified measuring set-up without a wave generation facility and without a synchronization circuit is thus enabled with the inventive method.

The inventive elasticity determination device includes an image recording unit (scanner), which is configured to acquire an image volume of an examination object with a tomographic imaging method in at least two different phases during the breathing movement of the examination object. The tomographic imaging method may include, for instance, a time series of proton-density weighted volume images, with which dynamic processes can be made visible. Furthermore, the elasticity determination device includes an image registration unit, which is configured to register the at least two recorded images with one another. The at least two recorded images can be recorded, as noted above, in the state of exhalation and in the state of inspiration. The elasticity determination deice has in addition a deformation field determination unit, which is configured to determine a deformation field from the images which have been registered with one another. The deformation field includes the information relating to the local deformation of the material included at least in a subarea of the image volume. The elasticity determination device has an elasticity determination unit, which is configured to determine the elasticity of the material included in the subarea of the image volume on the basis of the determined local deformation. The elasticity is produced in such cases from the relationship between the stress and expansion of a preformed material in the subarea of the image volume. For instance, the elasticity is clearly changed in a subarea of an organ to be examined, by comparison with its surroundings, if a tumor is established there or if the affected tissue is hardened by a fibrosis. This change can be displayed graphically with the use of the described elasticity determination device.

An imaging medical modality in accordance with the invention is a tomographic imaging system and includes the inventive elasticity determination device.

Many of the afore-cited components in the inventive elasticity determination device, in particular the image registration unit, the deformation field determination unit and the elasticity determination unit, can be realized wholly or partially in the form of software modules. This is advantageous because existing hardware facilities can be retrofitted for implementation of the inventive method by a software installation. The invention therefore also encompasses a non-transitory, computer-readable data storage medium that can be loaded directly into a processor of a programmable control computer of an imaging medical modality. The storage medium is encoded with program code (programming instructions), in order to cause all steps of the inventive method to be implemented, when the program is executed in the programmable control computer. The control computer can also include distributed units, for instance an image acquisition unit, an image registration unit, a deformation field determination unit and an elasticity determination unit, etc. or be part of the computer and actuate the aforementioned. A computer terminal can be considered to be a control computer, with which a user can actuate entries in order to control an imaging medical modality.

In a preferred embodiment of the inventive method, the body movement includes a breathing movement. The breathing movement is advantageous because it takes place relatively uniformly and periodically. Furthermore, the natural breathing movement does not need to be generated or triggered by external apparatuses, so that additional means are not required in order to generate mechanical waves in the body or to synchronize the excited mechanical waves.

In an embodiment of the inventive method, a vector field is firstly generated when determining the deformation field on the basis of the registration of the at least two image recordings. The vector field contains a displacement part and a deformation part. These two parts of the vector field are to be attributable to the fact that the body tissue in the image volume to be recorded is both displaced and also deformed in the case of a body movement. The vector field is then divided into a deformation part and a displacement part of the vector field and the deformation field is calculated on the basis of the deformation part of the vector field. In this manner, image artifacts determined conventionally as interference or the image data assigned to these image artifacts can thus be divided into their components such that the information required for the determination of the elasticity of an examination region can be insulated.

In an embodiment of the inventive method, the at least two image recordings are implemented in the breathed-out state and in the breathed-in state. In other words, at least one of the image recordings is recorded at the point in time at which the patient has partially or completely breathed out and at least one of the images recorded is recorded at the point in time at which the patient has partially or completely breathed in. It is to be expected that the change in the physical variables to be measured is at its greatest between these two states and a particularly precise measurement result can thus also be achieved.

In an alternative embodiment of the inventive method, a registration algorithm is used for registration on the basis of a biomechanical model. The biomechanical model models for instance, certain mechanical properties, such as spring constants, from which the elasticity of the region to be examined can be concluded. In this alternative embodiment of the inventive method, the registration step and the step for determining the deformation or elasticity are combined. When applying a biomechanical model, the liver is segmented in all volumes, as a result of which the surface is described. The registration brings the surfaces and the volumes into congruence. The liver tissue can then be modeled, e.g. using FEM (Finite Element Method) with the use of elasticity values from conventional elastography. It is now possible, for instance, to iteratively locally compare whether fibrotic or normal liver tissue suits deformation by registration better.

BRIEF DESCRIPTION OF THE DRAWINGS

FIG. 1 schematically shows the recording of raw data with different frequency encoding patterns.

FIG. 2 schematically shows the recording of raw data with a radial gradient trajectory.

FIG. 9 schematically illustrates a magnetic resonance system according to an exemplary embodiment of the invention.

DESCRIPTION OF THE PREFERRED EMBODIMENTS

Figure 3:
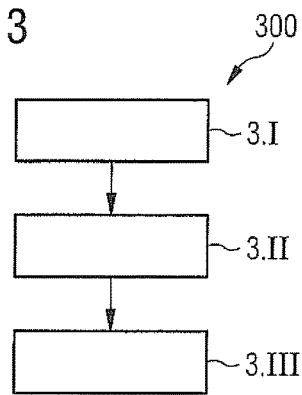
FIG. 3 is a flowchart illustrating the method for magnetic resonance imaging according to one exemplary embodiment of the invention.

FIG. 1 shows, in the two drawings, the recording of raw data using two different frequency encoding patterns, each based on Cartesian trajectories, which however are based on gradient fields with opposite signs. In the left drawing the frequency of the MR signals increases during the acquisition of the raw data from left to right, correspondingly the frequency encoding direction fed is oriented from left to right, and in the right drawing the frequency increases conversely from right to left, so that the frequency encoding direction rfed in the right-hand picture is from right to left. In the Cartesian trajectories used in FIG. 1 all image voxels generate signals with the same frequency in one column. The frequency encoding patterns with opposite signs used in both part-drawings mean that the region around the point $r_1$ and the region around the point $r_2$ is recorded with different frequencies in both part-drawings and in the case of frequency-dependent sensitivity $C_3(r,\omega)$ signals $S_3(t)$ of different strengths are also received in the coils. In other words, the attenuation of the signal $s(r,t)$ from a voxel i to the receiving coil j depends on the signal frequency and additionally on the internal distribution of electrical parameters, such as electrical conductivity and permittivity for example. In this case the electrical conductivity and permittivity are location-dependent and frequency-dependent variables which result in a frequency-dependent attenuation of the signal from a point r. If, during the recording of the raw data, the dependence of the sensitivity $C_3(r,\omega)$ on the frequency encoding pattern is not taken into consideration, this results in erroneous mappings if the frequency encoding pattern alters from one readout operation to another.

The frequency dependency of the sensitivity of the coils depends on the spatial distribution of the permittivity and the electrical conductivity of the region to be examined of the examination object and the structure of the coils themselves and the position of the coils relative to the examination object.

FIG. 2 illustrates the recording of raw data with a frequency encoding pattern for a radial receiving trajectory. The left drawing shows the receiving trajectory in the k-space. In the right drawing are the operations in the position space taking place during the recording of the raw data. If for example scanning takes place in the k-space along a spoke with the angle $k_\Theta$, the voxels which lie in the position space on a projection line oriented to the x axis at the angle $\Theta$, generate a signal with the same frequency, which signal is detected by the coil $C_j$. With each step with which progress is made outward in the k-space on a spoke, voxels are read out in the position space on a projection line which is adjacent in the frequency encoding direction fed. If a change is made in the k-space to a spoke with an angle different by $\Delta k_\Theta$, the projection direction also rotates in the position space by the angle $\Theta$, so that the frequency encoding pattern also rotates accordingly. Depending on the frequency encoding pattern, in other words depending on which spoke the scanning procedure is localized on in k-space, the frequency of a signal which is transmitted in the position space by a voxel at the position $r_i$ also alters. The attenuation with which the signal from the position $r_i$ is acquired in the right-hand part-drawing of FIG. 2 ultimately depends on the distribution of the electrical parameters, such as the electrical conductivity and the permittivity of the materials present in the examination region. The aforementioned variables also show, as already mentioned, a frequency dependency which impacts on the attenuation of the signal transmitted at the position $r_i$ and received by the coil $C_j$.

In the inventive method for magnetic resonance imaging precisely the frequency dependency illustrated, dependent on the frequency encoding pattern, should be taken into consideration when reading out the magnetic resonance signals.

The problem of the frequency dependency of the signals is noticeable because of the coil cross-coupling in particular during parallel image recording with several coils (PAT). According to the invention it is now assumed that the location-dependent coil sensitivities also have a frequency dependency, thus that the coil sensitivities depend both on the position of the region from which a signal which is received by the coils emanates, and on the frequency of the signal produced from the local values of the readout gradient assigned to the respective position.

To take the frequency dependency of the coil sensitivities into consideration, this frequency dependency will in the following describe calibration methods to be taken into consideration.

For this purpose, equation (1) is slightly modified, in order to take the frequency dependency of the sensitivity of the receiving coils into consideration.

$$S_1(t) = \iint C_1(r,\omega) \cdot s(r,t) \cdot e^{-i\phi(r,t)} dr \qquad (2)$$

In equation (2) the frequency $\omega$ is the frequency of the MR signal at the position r.

FIG. 3 illustrates a method 300 for MR imaging according to a first exemplary embodiment. In the method 300 the frequency dependency of the calibration values $C_1(r,\omega)$ or $w_1(k,\omega)$ is taken into consideration in step 3.I such that during the calibration measurement different steps of calibration measurement data are recorded with different frequency encoding patterns. In step 3.II a separate set of calibration values $C_1(r,\omega)$ or $w_1(k,\omega)$ is calculated from different sets of calibration measurement data for each frequency encoding pattern.

The calibration values are calculated on the basis of the signal amplitudes $S_1(t)$ occurring in equation (5).

In the SENSE method the calculated calibration values are the coil sensitivities $C_1(r, \omega)$ from equation (5).

In the GRAPPA method the calibration values are interpolation weightings $w_1(k,\omega)$ which, analogously to equations (2) to (4), are calculated from the calibration measurement data obtained during the calibration measurements.

However, the calibration, as already mentioned, is performed not just for a single frequency encoding pattern, but for several different frequency encoding patterns, so that now a set of calibration measurement data is also measured for each individual frequency encoding pattern, from which a set of interpolation weightings $w_1(k,\omega)$ is calculated for each of the different frequency encoding patterns.

The calibration is followed in both the SENSE method and the GRAPPA method in step 3.III by a parallel image reconstruction taking the calibration values $C_1$ or $w_1(k,\omega)$ into consideration. In the SENSE method the sets of image data determined by the individual coils 1 are corrected or adjusted to one another in the image space using the sensitivity values $C_1$.

As already mentioned, the parallel reconstruction in the GRAPPA method takes place by reconstructing the missing raw data in the k-space.

Figure 4:
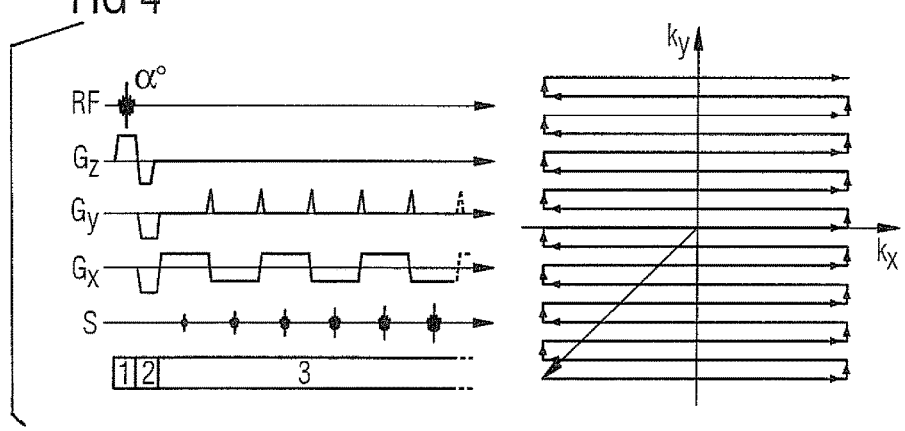
FIG. 4 illustrates scanning using a zigzag EPI method.

FIG. 4 illustrates an example of an MR measurement with a Cartesian zigzag trajectory. Because the k-space is scanned in two opposite directions, signals from a particular point in the position space have a different frequency depending on the direction of scanning. This phenomenon has already been illustrated in FIGS. 1 and 2. A pulse sequence suitable for a zigzag trajectory is shown in the left drawing. An excitation of a slice z with a particular RF pulse emitted by a transmitting antenna with the flip angle $\alpha^0$ takes place in the time interval 1. To this end a gradient field is switched in the z direction. Transverse magnetizations achieved by gradient fields switched in all directions are dephased in the time interval 2. The readout is performed in the time interval 3. In this case a frequency encoding gradient field is created in the x direction, which in the diagram shown in the right drawing corresponds to traversal of a row in k-space. Between the readout operations a phase encoding is generated in each case in the y direction by creating a phase encoding gradient field in the y direction, which in the diagram shown in the right-hand part-drawing corresponds to an advance into the next-higher row of the k-space trajectory, in other words in the y direction. At the same time the gradient in the x direction alters its sign, i.e. the frequency encoding pattern is inverted. In order to take the frequency dependency of the coil sensitivities $C_1(r,\omega)$ into consideration, calibration measurement data $S_1(t)$ with two different frequency encoding patterns corresponding to the two different directions of the k-space trajectory is acquired during the calibration procedure assigned to the trajectory shown. Sets of calibration values assigned to the respective frequency encoding patterns are calculated from the acquired calibration measurement data. Depending on the method type this may be coil sensitivities $C_1(r,\omega)$ or interpolation values $w_1(k)$. The image reconstruction finally takes place, taking into consideration the different sets of calibration values, wherein in the case of the SENSE method a correction or adjustment of the determined image data is performed in the image space using the sensitivity values $C_1$. In the case of the GRAPPA method the missing raw data is substituted in the k-space with the use of the calculated interpolation values $w_1(k)$. Based on the supplemented raw data, the actual image reconstruction then takes place in the image domain.

Figure 5:
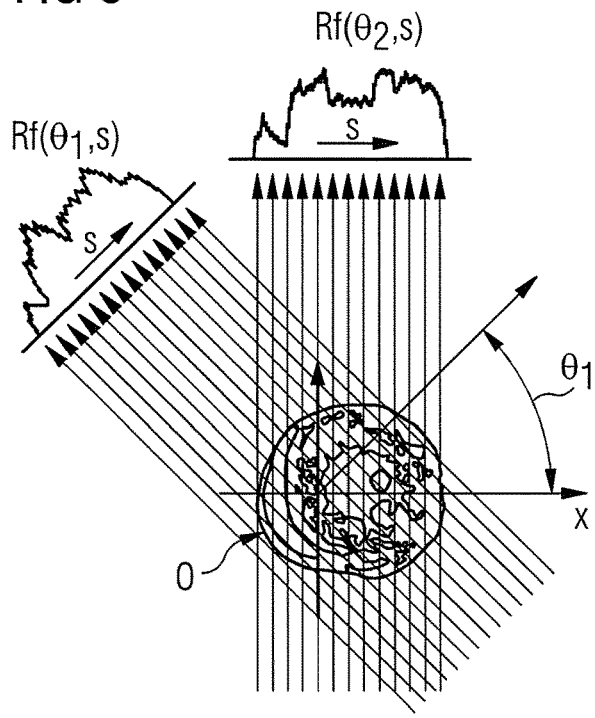
FIG. 5 illustrates scanning using a radial gradient trajectory in the image space.
Figure 6:
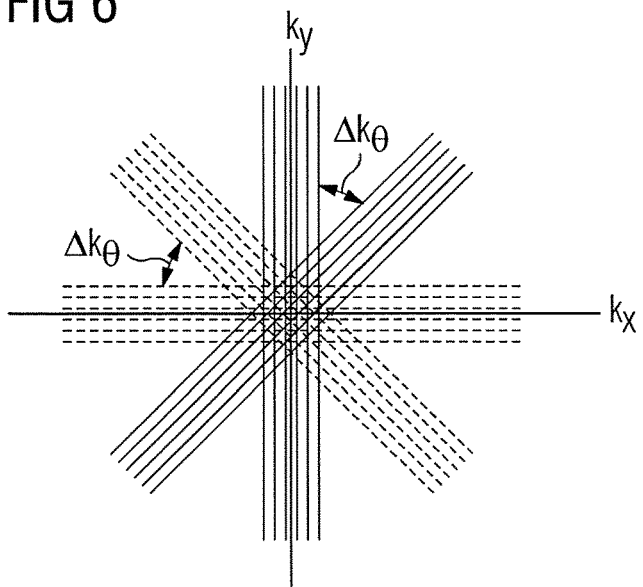
FIG. 6 shows an illustration corresponding to the representation in FIG. 5 of a frequency encoding pattern in k-space for the calibration of an MR image recording with a radial gradient trajectory.

FIGS. 5 and 6 illustrate another example of a PAT measurement with a radial receiving trajectory. FIG. 5 shows, in the position space or image space, projections $Rf(\theta,s)$ of an object O with the function $f(x,y)$ for different angles $\theta_1$ and $\theta_2$. During readout with a radial receiving trajectory a projection $Rf(\theta,s)$ with a separate frequency encoding pattern is performed for each radial line in the k-space in the position space. The radial lines in the k-space are rotated in respect of one another by an angle $\Delta k_\theta$, while projections corresponding to the individual radial lines are turned in the image space by an angle $\Delta\theta$ in respect of one another. Since different frequency dependencies of the coil sensitivities now occur for each projection in the image space because the projections are rotated by the angle $\Delta\theta$, calibration measurement data is recorded during calibration for several directions in k-space.

This is shown in FIG. 6. In this specific exemplary embodiment calibration measurement data is recorded in the k-space at angular increments $\Delta k_\theta=45°$. In other words, and in specific terms, 4 sets of calibration measurement data are recorded for 4 different frequency encoding patterns. The desired sets of calibration values or coil sensitivities $C_1(r,\omega)$ are calculated from this. Some of the lines of the radial trajectory in k-space may lie between the lines in k-space taken into consideration in the calibration measurement. The frequency encoding patterns corresponding to these lines can be taken into consideration by interpolation of the calibration values determined by the calibration, i.e. coil sensitivity values, for example.

During the calibration measurement known methods such as BLADE or PROPELLER for example can be employed. For this, lines parallel to one another in the corresponding direction of the assigned k-space spoke can be scanned about the k-space center for each projection direction or part thereof. The calibration values to be calculated, i.e. coil sensitivities or interpolation weightings, then emerge from equation (2) or a corresponding equation system in the GRAPPA method.

Figure 7:
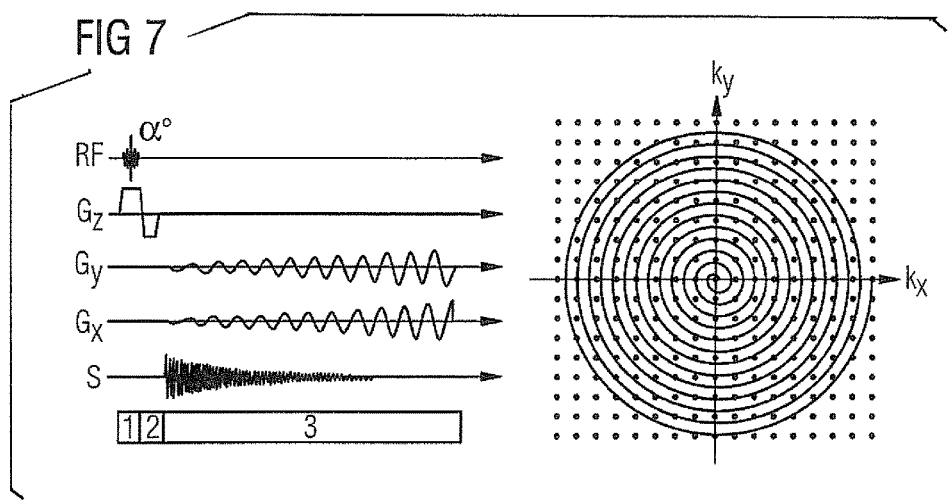
FIG. 7 is a flowchart illustrating the method for magnetic resonance imaging according to an alternative exemplary embodiment of the invention.

FIG. 7 shows an alternative exemplary embodiment with a spiral receiving trajectory. In this case the frequency encoding pattern changes continuously. As can be seen in FIG. 7, the form of the gradients in the x and y direction is sinusoidal with increasing amplitude. In this specific frequency encoding pattern an alternative procedure for the inventive method is selected, which is illustrated in FIG. 8.

Figure 8:
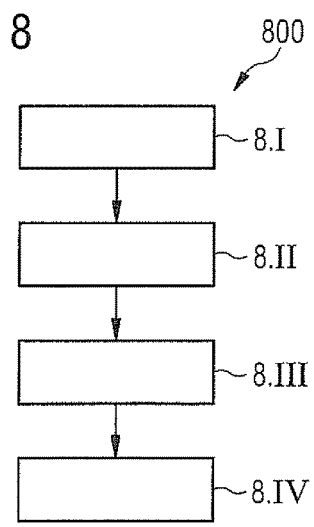
FIG. 8 is a diagram that illustrates scanning using a spiral gradient trajectory.

In the method 800 shown in FIG. 8, a calibration is not performed by measuring signals in different projection directions, but instead in step 8.I a transmission profile measurement of the $B1^+$ field is performed in the region of the examination object to be mapped. Alternatively or additionally a receiving profile measurement, i.e. a $B1^-$ field measurement, could take place. Based on the magnetic field values obtained thereby, in step 8.II values for the physical variables of electrical conductance value and permittivity are calculated for the region of the examination object to be mapped. Calibration values, e.g. coil sensitivities or GRAPPA weightings, are calculated from the computed values of the physical variables in step 8.III for a few frequency encoding patterns. The image reconstruction then takes place in step 8.IV on the basis of calibration values obtained by interpolation between the calculated calibration values.

A similar procedure is also possible in encoding methods such as O-Space, Patloc, 4D-Rio or similar, for example, in which nonlinear gradients are used for signal encoding.

In conclusion, FIG. 9 shows in rough schematic form an inventive magnetic resonance tomography system 1 (also referred to as "MR system" for short in the following), which is designed to perform an inventive method. The MR system firstly comprises the actual magnetic resonance scanner 2 with an examination space 3 or patient tunnel, into which an examination object O, or here a patient or test person in whose body the examination object, for example a particular organ, is located, can be inserted on a couch 8.

The magnetic resonance scanner 2 is normally fitted with a basic field magnetic system 4, a gradient system 6 and an HF transmitting antenna system 5 and an HF receiving antenna system 7. In the exemplary embodiment shown the HF transmitting antenna system 5 is a whole-body coil permanently installed in the magnetic resonance scanner 2, whereas the HF receiving antenna system 7 comprises local coils with receiving coils C1, C2, C3 arranged on the patient or test person (in FIG. 9 this is symbolized by three receiving coils C1, C2, C3; generally multiple receiving coils are involved). The receiving coils C1, C2, C3 are mostly grouped in units with a common housing, which are often referred to as local coils. In principle however the whole-body coil can be used as an HF receiving antenna system and the local coils as an HF transmitting antenna system, providing these coils can each be switched to different operating modes. In the most effective exemplary embodiments of the inventive method multiple receiving coils are available for parallel measurement.

The basic field magnetic system 4 is here normally designed such that it generates a basic magnetic field in the longitudinal direction of the patient, i.e. along the longitudinal axis of the magnetic resonance scanner 2 running in the z direction. The gradient system 6 normally comprises individually controllable gradient coils, in order to be able to switch gradients independently of one another in the x, y or z direction.

The MR system 1 illustrated in FIG. 8 is a whole-body system with a patient tunnel into which a patient can be completely introduced. However, in principle the invention can also be used on other MR systems, e.g. with a laterally open, C-shaped housing, but in particular also with smaller magnetic resonance scanners, into which for example only part of a body can be positioned.

The MR system 1 furthermore has a central control unit 13 which is used to control the MR system 1. This central control device 13 has a sequence control unit 14 for measurement sequence control. With this the sequence of radio-frequency pulses (RF pulses) and of gradient pulses can be controlled as a function of a selected pulse sequence PS or a sequence of several pulse sequences for recording several slices or volumes in a volume region of interest of the examination object within one measurement session. Such a pulse sequence PS can be predefined and parameterized for example within a measurement or control protocol PR. Normally different control protocols PR are stored in a memory 19 for different measurements or measurement sessions and can be selected by an operator (and where appropriate altered if necessary) and then used to perform the measurement. In the present case a pulse sequence is selected such that raw data is acquired in the desired raster using scanning at too low a frequency in parallel using several receiving coils.

Prior to the imaging measurement sequence a calibration sequence KS is output by the sequence control unit 14, with which calibration measurement data $S_1(t)$ for different frequency encoding patterns is recorded.

To output the individual RF pulses of a pulse sequence PS the central control device 13 has a radio-frequency transmission device 15 which generates and amplifies the RF pulses and feeds them via a suitable interface (not shown in detail) to the HF transmitting antenna system 5. To control the gradient coils of the gradient system 6, in order to switch the gradient pulses appropriately in accordance with the predefined pulse sequence, the control device 13 has a gradient system interface 16. The sequence control unit 14 communicates in suitable fashion, e.g. by transmitting sequence control data SD, with the radio-frequency transmission device 15 and the gradient system interface 16 to execute the pulse sequences. The control device 13 also has a radio-frequency receiving device 17 (likewise communicating in appropriate fashion with the sequence control unit 14), in order to receive magnetic resonance signals in a coordinated fashion by means of the HF receiving antenna system 7 within the readout window predefined by the pulse sequence PS and the calibration sequence KS, and thus to acquire the raw data RD after demodulation and digitization.

A reconstruction device 20 here accepts the acquired raw data RD, here at a raw data interface 21 (also called a receiving unit), and from it reconstructs image data BD for the desired field of view. This reconstruction too generally takes place on the basis of parameters which are predefined in the respective measurement protocol.

In the present case the reconstruction device 20 is designed such that it can work in accordance with the inventive method.

To this end it has a determination unit 22 in addition to the receiving unit 21. The determination unit 22 is used to calculate calibration values $C_1(r, \omega)$ or $w_1(k,\omega)$. The reconstruction device 20 additionally has an image reconstruction unit 23, by which an image reconstruction is performed on a frequency-dependent basis based on the acquired raw data RD and the determined calibration values $C_1(r,\omega)$ or $w_1(k,\omega)$.

In the case of the SENSE method the image reconstruction unit 23 corrects the fold artifacts in the image space resulting from scanning at too low a frequency and the different sensitivities of the coils. In the case of the GRAPPA method the image reconstruction unit 23 completes the raw data RD with the help of the determined weightings $w_1(k,\omega)$ and in the manner referred to above reconstructs the image data BD on the basis of the completed raw data RD. This image data can then for example be stored in a memory 19, displayed on a suitable display and/or transmitted via a network.

The central control device 13 can be operated by a terminal with an input unit 10 and a display unit 9, via which the whole MR system 1 can thus also be operated by one operator. MR images can also be displayed on the display unit 9, and by means of the input unit 10, if appropriate in combination with the display unit 9, measurements can be planned and initiated and in particular control protocols PR with suitable pulse sequences KS, PS as explained above can be selected and if appropriate modified.

The inventive MR system 1 and in particular the control device 13 can additionally have a number of other components which are not shown here individually but which are normally present in such systems, for example a network interface to link the whole system to a network, and to be able to exchange raw data and/or image data or parameter maps, as well as other data such as patent-related data or control protocols.

Finally it should be noted once again that the methods and devices described above in detail are exemplary embodiments and that the basic principle can also be varied in many ways by those skilled in the art, without departing from the scope of the invention. Thus, for example, the reconstruction device 20 can also be implemented on the terminal instead of in the control device 13, or on a separate computer system which for example is linked to the magnetic resonance system 1 via the network NW. The directions in space can also be freely selected, i.e. the x and y direction can for example be transposed. Likewise the method can analogously also be applied in three-dimensional k-space or hybrid and image space.

I claim as my invention:

1. A method for magnetic resonance imaging, comprising:
   operating a magnetic resonance scanner to detect signals representing raw magnetic resonance data from a region of an examination subject via a number of magnetic resonance receiving antennas of the magnetic resonance scanner, with an image reconstruction algorithm being subsequently applied to said raw magnetic resonance data so as to reconstruct an image, comprised of image elements, of the examination subject, with said image elements representing a signal strength of said signals, each of said magnetic resonance receiving antennas having a signal reception sensitivity, which has a dependency on frequency that attenuates said signal strength;

in a processor, making a frequency-dependent determination of calibration values for at least one of said magnetic resonance receiving antennas so that the calibration values have a value contribution resulting from said dependency on frequency of the sensitivity of said at least one of said magnetic resonance receiving antennas, that compensates for the attenuation of said signal strength; and in said processor, executing said image reconstruction algorithm so as to reconstruct said image based on the raw magnetic resonance data using the determined calibration values, so that said image elements of said image are not adulterated by said attenuation of said signal strength.

2. A method as claimed in claim 1 comprising determining several sets of said calibration values for respectively different frequency encoding patterns that are used for acquiring the raw data.

3. The method as claimed in claim 2 comprising entering said raw magnetic resonance data into k-space using a Cartesian acquisition pattern as the frequency encoding pattern, with adjacent rows in k-space being in opposite directions, and with different calibration values being determined for each of said opposite directions.

4. A method as claimed in claim 2 comprising entering said raw magnetic resonance data into k-space along a radial trajectory pattern as said frequency encoding pattern.

5. A method as claimed in claim 4 comprising entering said raw magnetic resonance data into k-space along at least two radial trajectories oriented at a non-zero angle relative to each another in k-space.

6. A method as claimed in claim 4 comprising entering said raw magnetic resonance data into k-space along at least four radial trajectories respectively oriented at 45° relative to each another in k-space.

7. A method as claimed in claim 4 comprising using a data acquisition method selected from the group consisting of a BLADE method and a PROPELLER method for determining said calibration measurement data.

8. A method as claimed in claim 1 comprising, while determining said calibration values, acquiring a plurality of sets of calibration measurement data for respectively different frequency encoding patterns, and determining the calibration values from the acquired calibration measurement data.

9. A method as claimed in claim 1 comprising determining said calibration values as values in the image domain or as interpolation weightings in k-space.

10. A method as claimed in claim 1 comprising determining multiple sets of said calibration values based on a transmit profile measurement or a reception profile measurement.

11. A method as claimed in claim 1 comprising performing the image reconstruction based on values interpolated between the determined calibration values.

12. A method as claimed in claim 1 comprising using a non-linear gradient profile to generate a frequency encoding pattern for acquiring the raw data.

13. A control device for a magnetic resonance apparatus, comprising:

a processor configured to receive raw magnetic resonance data acquired by detecting signals from a region of an examination subject via a number of magnetic resonance receiving antennas of a magnetic resonance scanner of the magnetic resonance apparatus, with an image reconstruction algorithm being subsequently applied to said raw magnetic resonance data so as to reconstruct an image, comprised of image elements, of the examination subject, with said image elements representing a signal strength of said signals, each of said magnetic resonance receiving antennas having a signal reception sensitivity, which has a dependency on frequency that attenuates said signal strength;

said processor being configured to make a frequency-dependent determination of calibration values for at least one of said magnetic resonance receiving antennas so that the calibration values have a value contribution, resulting from said dependency on frequency of the sensitivity of said at least one of said magnetic resonance receiving antennas, that compensates for the attenuation of said signal strength; and said processor being configured to execute said image reconstruction algorithm so as to reconstruct said image based on the raw magnetic resonance data using the determined calibration values, so that said image elements of said image are not adulterated by said attenuation of said signal strength.

14. A magnetic resonance apparatus comprising:

a magnetic resonance seamier comprising a number of magnetic resonance receiving antennas, each having a signal reception sensitivity that has a dependency on frequency;

a control computer configured to operate said magnetic resonance scanner to detect signals representing raw magnetic resonance data from a region of an examination subject via said number of magnetic resonance receiving antennas of the magnetic resonance scanner with an image reconstruction algorithm being subsequently applied to said raw magnetic resonance data so as to reconstruct an image, comprised of image elements, of the examination subject, with said image elements representing a signal strength of said signals, said signal reception sensitivity that has a dependency on frequency causing an attenuation of said signal strength;

said control computer being configured to make a frequency-dependent determination of calibration values for at least one of said magnetic resonance receiving antennas so that the calibration values have a value contribution resulting from said dependency on frequency of the sensitivity of said at least one of said magnetic resonance receiving antennas, that compensates for the attenuation of said signal strength; and said control computer being configured to execute said image reconstruction algorithm so as to reconstruct said image based on the raw magnetic resonance data using the determined calibration values, so that said image elements of said image are not adulterated by said attenuation of said signal strength.

15. A non-transitory, computer-readable data storage medium encoded with programming instructions, said storage medium being loaded into a processor of a magnetic resonance apparatus that comprises a magnetic resonance scanner having a number of magnetic resonance receiving antennas, each of said receiving antennas having a signal reception sensitivity that has a dependency on frequency, and said programming instructions causing said processor to:
- operate said magnetic resonance scanner to detect signals representing raw magnetic resonance data from a region of an examination subject via said number of magnetic resonance receiving antennas of the magnetic resonance scanner, with an image reconstruction algorithm being subsequently applied to said raw magnetic resonance data so as to reconstruct an image, comprised of image elements, of the examination subject, with said image elements representing a signal strength of said signals, said signal reception sensitivity that has a dependency on frequency causing an attenuation of said signal strength;
- make a frequency-dependent determination of calibration values for at least one of said magnetic resonance receiving antennas so that the calibration values have a value contribution, resulting from said dependency on frequency of the sensitivity of said at least one of said magnetic resonance receiving antennas, that compensates for the attenuation of said signal strength; and
- execute said image reconstruction algorithm to reconstruct said image based on the raw magnetic resonance data using the determined calibration values, so that said image elements of said image are not adulterated by said attenuation of said signal strength.

* * * * *